United States Patent [19]

Meng et al.

[11] Patent Number: 5,453,403

[45] Date of Patent: Sep. 26, 1995

[54] METHOD OF BEVELED CONTACT OPENING FORMATION

[75] Inventors: Teo Y. Meng; Liu Lianjun, both of Singapore, Singapore

[73] Assignee: Chartered Semiconductor Manufacturing Pte, Ltd., Singapore, Singapore

[21] Appl. No.: 328,584

[22] Filed: Oct. 24, 1994

[51] Int. Cl.$^6$ .............................................. H01L 21/3065
[52] U.S. Cl. .................... 437/195; 437/947; 437/981; 437/228; 156/644.1; 156/651.1
[58] Field of Search .................................. 437/195, 203, 437/228, 981, 947; 148/DIG. 161; 204/192.35, 192.37; 156/644.1, 657.1, 643.1, 653.1

[56] References Cited

U.S. PATENT DOCUMENTS

| | | | |
|---|---|---|---|
| 4,764,245 | 8/1988 | Grewal | 156/657 |
| 4,807,016 | 2/1989 | Douglas | 156/644 |
| 4,814,041 | 3/1989 | Auda | 156/644 |
| 4,832,788 | 5/1989 | Nemiroff | 156/644 |
| 4,857,141 | 8/1989 | Abe et al. | 156/657 |
| 4,889,588 | 12/1989 | Fior | 204/192.37 |
| 4,902,377 | 2/1990 | Berglund et al. | 156/644 |
| 4,908,333 | 3/1990 | Shimokawa et al. | 437/195 |
| 5,155,064 | 10/1992 | Mise | 437/195 |
| 5,180,689 | 1/1993 | Liu et al. | 437/981 |
| 5,203,957 | 4/1993 | Yoo et al. | 1516/643 |
| 5,219,791 | 6/1993 | Freiberger | 437/195 |
| 5,294,296 | 3/1994 | Yoon et al. | 437/947 |
| 5,320,981 | 6/1994 | Blalock | 437/228 |

FOREIGN PATENT DOCUMENTS

| | | | |
|---|---|---|---|
| 0103842 | 4/1989 | Japan | 437/947 |
| 0016217 | 1/1991 | Japan | 437/947 |

*Primary Examiner*—Tuan H. Nguyen
*Attorney, Agent, or Firm*—George O. Saile

[57] ABSTRACT

This invention provides a method of forming contact holes and via holes in interlevel dielectric which insure good metal stepcoverage. The contact or via holes have tapered sides and smoothed edges. The method uses isotropic etching, anisotropic etching, and argon sputter etching in vacuum and does not require high temperature contact reflow. The final argon sputter etch is a timed etch that smoothes all sharp edges, exposes the regions where electrical contact will be made, and planarizes the interlevel dielectric.

21 Claims, 4 Drawing Sheets

METHOD OF BEVELED CONTACT OPENING FORMATION

BACKGROUND OF THE INVENTION (1) Field of the Invention

The invention relates to the formation of tapered contact or via holes without sharp edges which are necessary in providing good metal stepcoverage in high density integrated circuits. The tapered holes are formed using conventional sputter technology. A contact reflow process step is not required.

(2) Description of Related Art

High density integrated circuit technology requires the use of interlevel dielectric layers between layers of conducting electrode patterns. These layers of interlevel dielectric have contact holes formed in the interlevel dielectric layers to provide electrical communication to the integrated circuit devices and via holes formed in the interlevel dielectric to provide electrical communication between layers of conducting electrodes. These contact or via holes require good metal stepcoverage to insure reliable electrical contacts with low contact resistance. For the small diameter contact or via holes required for high density circuits good metal stepcoverage requires a contact or via hole opening with a taper and without sharp edges.

The importance of tapered contact and via holes has been recognized for some time and many have worked on methods of achieving them. Previous methods of forming tapered contact or via holes have required the use of a high temperature contact reflow step to smooth the sharp corners at the edges of the contact or via hole opening. The current invention forms tapered contact or via hole openings without the need for the high temperature reflow step, which can frequently be a problem in integrated circuit processing. In the current invention an argon sputter etch is used to provide a smooth taper at the edge of the contact or via hole opening.

U.S. Pat. No. 5,203,957 to Yoo et al also uses argon sputter etching in the formation of contact or via hole openings. However, in the current invention the argon sputter etch is simultaneously used to planarize the interlevel dielectric layer as well as smooth the edges of the contact or via hole opening.

SUMMARY OF THE INVENTION

It is the object of this invention to provide a method for forming beveled contact and via hole openings in interlevel dielectric layers using isotropic etching, anisotropic etching, and argon sputter etching without the need for high temperature contact reflow.

This objective is achieved by a vertically anisotropically etching the interlevel dielectric layer after the contact or via hole is opened in the photoresist mask. The cavity formed by the vertical anisotropic etch is widened by using an isotropic etch. A second vertical anisotropic etch extends the cavity vertically, however interlevel dielectric material remains at the bottom of the cavity. The photoresist mask is then removed and the structure is subjected to a timed argon sputter etch in vacuum. The argon sputter etch removes sufficient interlevel dielectric material so that the metal contact area beneath the interlevel dielectric is exposed. The argon sputter etch also smooths the sharp edges at the top of the contact or via hole opening and at the transition region between the isotropically etched areas and anisotropically etched areas. This smoothing effect eliminates the need for contact hole reflow which is a high temperature process and often can not be tolerated at this stage of the integrated circuit processing. The argon sputter etch also planarizes the interlevel dielectric layer which is an important advantage for structures having a number of levels.

The objective is also achieved by isotropically etching the interlevel dielectric layer after the contact or via hole is opened in the photoresist mask. The cavity formed by the isotropic etch is then vertically extended by vertically anisotropically etching the interlevel dielectric material. The photoresist mask is then stripped and the structure is subjected to a timed argon sputter etch as described in the previous paragraph. Again key features of the current invention are the elimination of the need for the contact reflow step and the planarization of the interlevel dielectric layer.

DESCRIPTION OF THE PREFERRED EMBODIMENTS

Figure 1:
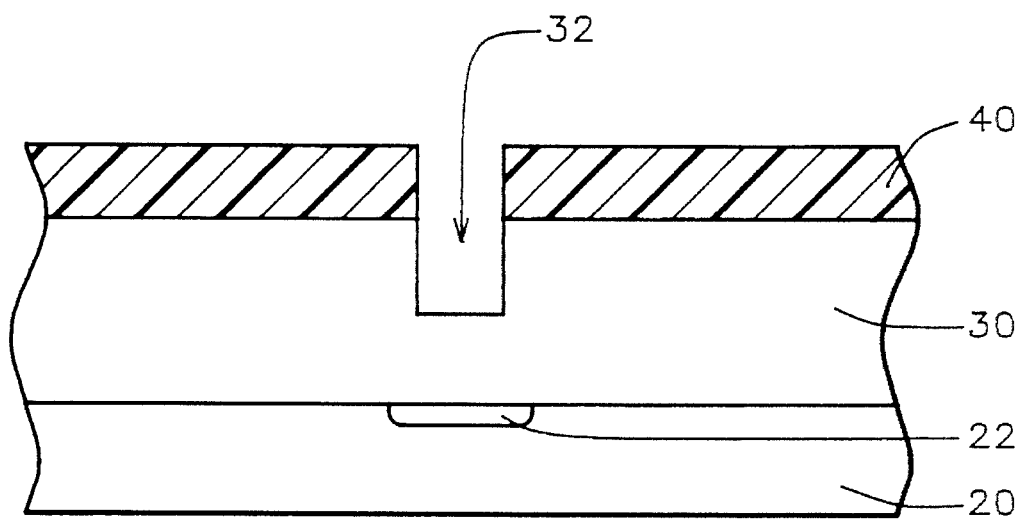
FIG. 1 is a cross section view of an integrated circuit device showing a first vertical anisotropic etching of the interlevel dielectric layer through the contact or via hole opening in the photoresist mask.

Refer now to FIG. 1 through FIG. 4, there is shown an embodiment of the current invention. FIG. 1 shows a cross section of an integrated circuit device having a silicon substrate 20 with a contact area 22 covered by an interlevel dielectric layer 30. The silicon substrate can have N-channel MOSFETs, P-channel MOSFETs, CMOS FETs, bipolar transistors or combinations thereof formed therein by conventional techniques. Examples of such conventional techniques are described in the book "VLSI TECHNOLOGY" Second Edition by S. M. Sze Published by McGraw-Hill Book Co., New York, N.Y. 1988 Pages 466–512. The interlevel dielectric layer 30 can be a material such as $SiO_2$ with a thickness of at least 10,000 Angstroms borophosphosilicate glass with a thickness of at least 10,000 Angstroms. A layer of photoresist 40 is formed over the interlevel dielectric layer 30. A contact hole opening is formed in the photoresist layer 40 directly over the contact area 22 using standard lithographic techniques.

Figure 2:
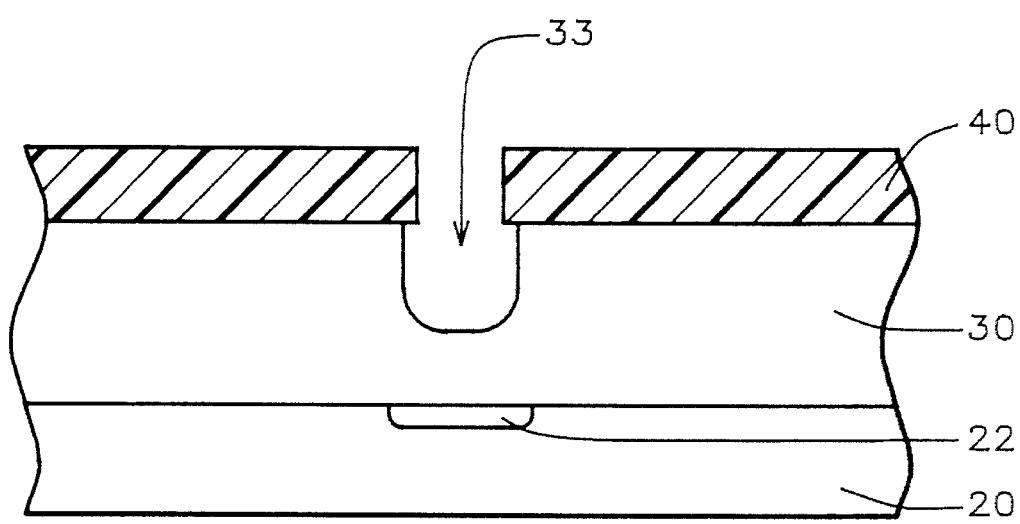
FIG. 2 is a cross section view of an integrated circuit device showing widening the cavity in the interlevel dielectric layer by isotropic etching through the contact or via hole opening in the photoresist mask.
Figure 3:
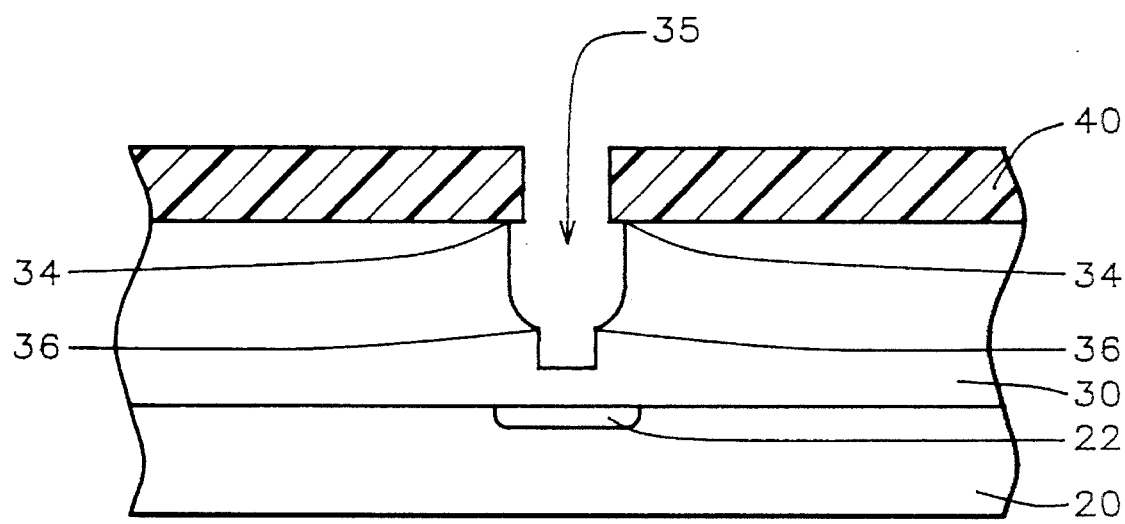
FIG. 3 is a cross section view of an integrated circuit device showing vertical extension of the cavity in the interlevel dielectric layer by vertical anisotropic etching through the contact or via hole opening in the photoresist mask.

A primary contact cavity 32 is then formed by vertical anisotropic etching the interlevel dielectric layer through the contact hole opening in the photoresist layer using $CF_4$+ $CHF_3$ reactive ion etching at a temperature of between about 20° C. and 20° C. The resulting primary contact cavity has a perimeter determined by the contact hole opening in the photoresist layer and a depth of at least 5000 Angstroms. Next, as shown in FIG. 2, the primary contact cavity is enlarged to form a secondary contact cavity 33 by isotropic etching the interlevel dielectric through the contact hole in the photoresist layer using wet or dry etching with HF. Next, as shown in FIG. 3, the secondary contact cavity is vertically extended to form a semifinal contact cavity 35 by vertical anisotropic etching the interlevel dielectric layer through the contact hole opening in the photoresist layer using $CF_4$+ $CHF_3$ reactive ion etching at a temperature of between about 20° C. and 40° C. As shown in FIG. 3 the semifinal contact cavity has sharp edges at the top of the semifinal contact cavity 34 and at the transition from the enlarged secondary contact cavity and the vertical extension forming the semifinal contact cavity 36. At this stage of the processing the contact area 22 is still covered by the interlevel dielectric 30.

Figure 4:
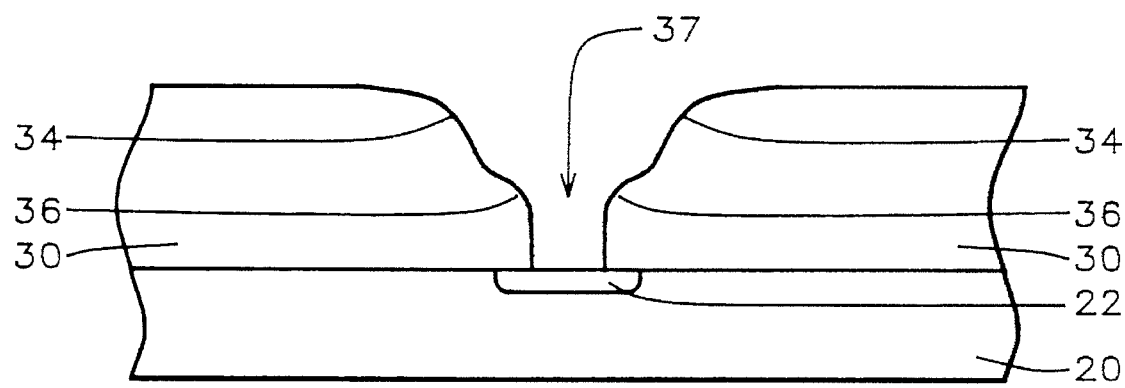
FIG. 4 is a cross section view of an integrated circuit device showing the completed tapered contact or via hole opening with smooth edges.

Next the photoresist layer is removed and the structure is subjected to an argon sputter etch in vacuum using $CF_4$ doped argon sputter etch having a $CF_4$ to argon ratio of less than 20% at about 500 watts in a vacuum of about $300 \times 10^{-6}$ Torr. As shown in FIG. 4 the argon sputter etch removes sufficient amount of interlevel dielectric 30 to expose the contact area 22 at the bottom of the final contact cavity 37. The sharp edges have been smoothed by the argon sputter etch and now have rounded profiles at the top of the final contact cavity 34 and at the transition from the enlarged secondary contact cavity region and the vertical extension forming the semifinal contact cavity 36. The argon sputter etch also planarizes the interlevel dielectric which will enhance later processing steps. The contact hole has now been formed having tapered sides with no sharp edges without the need for a contact reflow step. This embodiment is for a contact hole extending to the integrated circuit. The method also can be used for via holes extending from one level of metal electrodes to another level of metal electrodes through the .interlevel dielectric.

Figure 5:
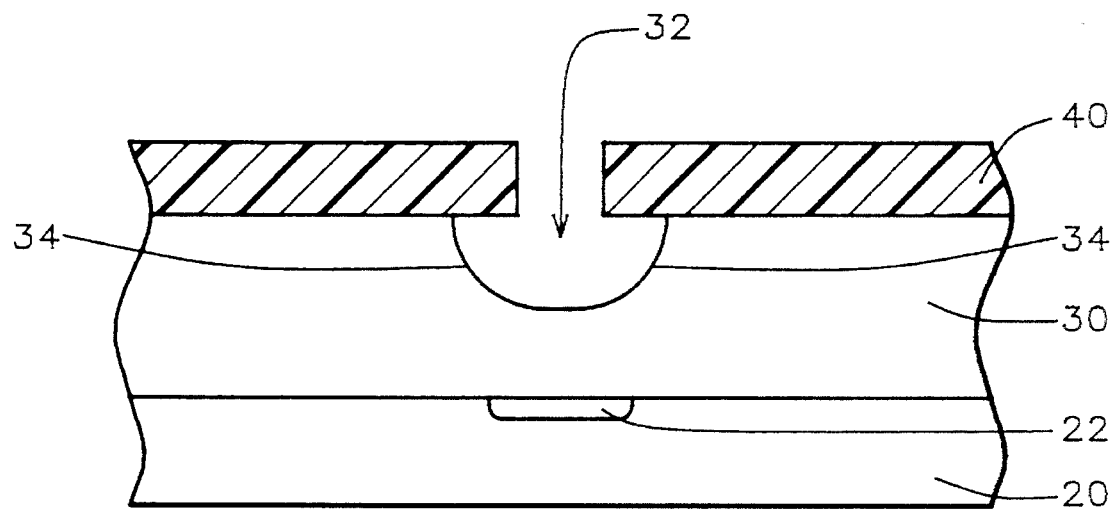
FIG. 5 is a cross section view of an integrated circuit device showing a cavity formed in the interlevel dielectric layer by isotropic etching through the contact or via hole opening in the photoresist mask.
Figure 6:
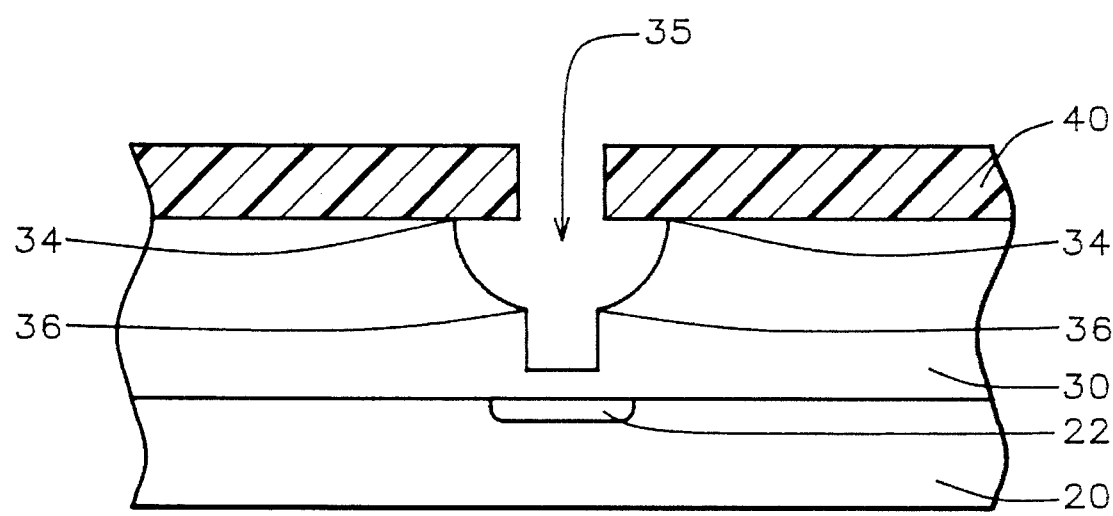
FIG. 6 is a cross section view of an integrated circuit device showing vertical extension of the cavity in the interlevel dielectric layer by vertical anisotropic etching through the contact or via hole opening in the photoresist mask.
Figure 7:
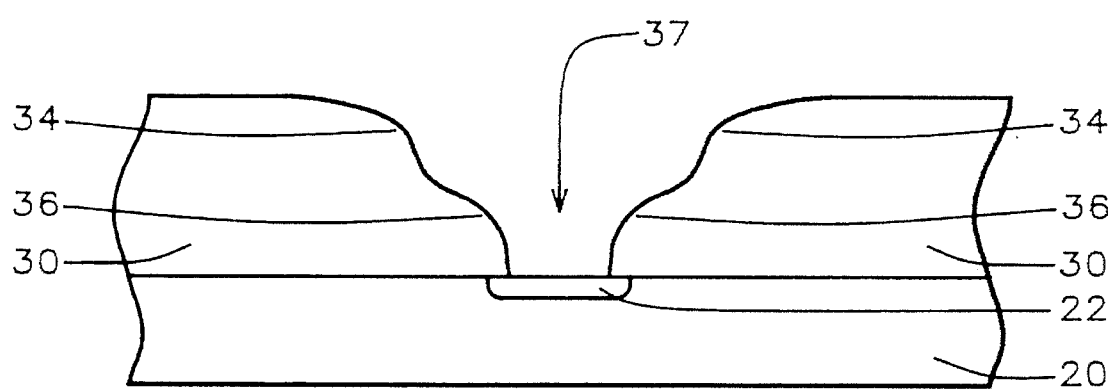
FIG. 7 is a cross section view of an integrated circuit device showing the completed tapered contact or via hole opening with smooth edges.

Refer now to FIG. 5 through FIG. 7, there is shown another embodiment of the current invention. FIG. 5 shows a cross section of an integrated circuit device having a silicon substrate 20 with a contact area 22 covered by an interlevel dielectric layer 30. As in the previous embodiment the silicon substrate can have N-channel MOSFETs, P-channel MOSFETs, CMOS FETs, bipolar transistors or combinations thereof formed therein by conventional techniques. The interlevel dielectric layer 30 can be a material such as $SiO_2$ with a thickness of at least 10,000 Angstroms or borophosphosilicate glass with a thickness of at least 10,000 Angstroms. A layer of photoresist 40 is formed over the interlevel dielectric layer 30. A contact hole opening is formed in the photoresist layer 40 directly over the contact area 22 using standard lithographic techniques.

As shown in FIG. 5 a primary contact cavity 32 is formed in the interlevel dielectric by isotropic etching the interlevel dielectric using wet or dry etching with HF. Next, as shown in FIG. 6, the primary contact cavity is vertically extended to form a secondary contact cavity 35 by vertical anisotropic etching the interlevel dielectric layer through the contact hole opening in the photoresist layer using $CHF_3$+$CHF_4$ reactive ion etching at a temperature of between about 20° C. and 40° C. As shown in FIG. 6 the semifinal contact cavity has sharp edges at the top of the secondary contact cavity 34 and at the transition from the primary contact cavity and the vertical extension forming the secondary contact cavity 36. At this stage of the processing the contact area 22 is still covered by the interlevel dielectric 30.

Next the photoresist layer is removed and the structure is subjected to an argon sputter etch in vacuum using $CF_4$ doped argon sputter etch having a $CF_4$ to argon ratio of less than 20% at about 500 watts in a vacuum of about $300 \times 10^{-6}$ Torr. As shown in FIG. 7 the argon sputter etch removes sufficient amount of interlevel dielectric 30 to expose the contact area 22 at the bottom of the final contact cavity 37. The sharp edges have been smoothed by the argon sputter etch and now have rounded profiles at the top of the final contact cavity 34 and at the transition from the primary contact cavity region and the vertical extension forming the secondary contact cavity 36. The argon sputter etch also planarizes the interlevel dielectric which will enhance later processing steps. The contact hole has now been formed having tapered sides with no sharp edges without the need for a contact reflow step. This embodiment is for a contact hole extending to the integrated circuit. The method also can be used for via holes extending from one level of metal electrodes to another level of metal electrodes through the interlevel dielectric.

While the invention has been particularly shown and described with reference to the preferred embodiments thereof, it will be understood by those skilled in the art that various changes in form and details may be made without departing from the spirit and scope of the invention.

What is claimed is:

1. A method of forming a tapered contact or via hole opening, comprising the steps of:

providing an integrated circuit structure having a silicon substrate with device elements contained therein, an interlevel dielectric layer thereover, and metal contact areas under said interlevel dielectric layer;

forming a photoresist masking layer over said interlevel dielectric layer;

forming contact or via hole openings in said photoresist masking layer directly over said metal contact areas;

forming primary contact cavities in said interlevel dielectric layer by means of a first vertical anisotropic etch of said interlevel dielectric layer through said contact or via hole openings in said photoresist masking layer so that a portion of said interlevel dielectric layer remains over said metal contact areas;

forming secondary contact cavities by enlarging said primary contact cavities by means of an isotropic etch of said interlevel dielectric layer through said contact or via hole openings in said photoresist masking layer so that a portion of said interlevel dielectric layer remains over said metal contact areas;

forming semifinal contact cavities by vertically extending said secondary contact cavities by means of a second vertical anisotropic etch of said interlevel dielectric layer through said contact or via hole openings in said photoresist masking layer so that a portion of said interlevel dielectric layer remains over said metal contact area;

removing said photoresist masking layer; and subjecting said integrated circuit structure to an Argon sputter etch thereby forming final contact cavities from said semifinal contact cavities, smoothing the sharp edges in said final contact cavities, removing the remaining interlevel dielectric layer over said metal contact areas thereby exposing said metal contact areas, and planarizing said interlevel dielectric layer.

2. The method of claim 1 wherein said interlevel dielectric layer is $SiO_2$.

3. The method of claim 2 wherein said $SiO_2$ interlevel dielectric layer has a thickness of at least 10,000 Angstroms.

4. The method of claim 1 wherein said interlevel dielectric layer is borophosphosilicate glass.

5. The method of claim 4 wherein said borophosphosilicate glass interlevel dielectric layer has a thickness of at least 10,000 Angstroms.

6. The method of claim 1 wherein said first vertical anisotropic etch uses $CF_4+CHF_3$ reactive ion etch at a temperature of between about 20° C. and 40° C.

7. The method of claim 1 wherein said second vertical anisotropic etch uses $CF_4+CHF_3$ reactive ion etch at a temperature of between about 20° C. and 40° C.

8. The method of claim 1 wherein said isotropic etch uses wet or dry etching with HF.

9. The method of claim 1 wherein said Argon sputter etch uses $CF_4$ doped argon sputter etching having a $CF_4$ to argon ratio of less than 20%.

10. The method of claim 1 wherein said integrated circuit structure includes metal oxide semiconductor field effect transistors.

11. The method of claim 1 wherein said integrated circuit structure includes bipolar transistors.

12. A method of forming a tapered contact or via hole opening, comprising the steps of:

providing an integrated circuit structure having a silicon substrate with device elements contained therein, an interlevel dielectric layer thereover, and metal contact areas under said interlevel dielectric layer;

forming a photoresist masking layer over said interlevel dielectric layer;

forming contact or via hole openings in said photoresist masking layer directly over said metal contact areas;

forming primary contact cavities in said interlevel dielectric layer by means of an isotropic etch of said interlevel dielectric layer through said contact or via hole openings in said photoresist masking layer so that a portion of said interlevel dielectric layer remains over said metal contact areas;

forming secondary contact cavities by vertically extending said primary contact cavities by means of a vertical anisotropic etch of said interlevel dielectric layer through said contact or via hole openings in said photoresist masking layer so that a portion of said interlevel dielectric layer remains over said metal contact areas;

removing said photoresist masking layer; and subjecting said integrated circuit structure to an Argon sputter etch thereby forming final contact cavities from said secondary contact cavities, smoothing the sharp edges in said final contact cavities, removing the remaining interlevel dielectric layer over said metal contact areas thereby exposing said metal contact areas, and planarizing said interlevel dielectric layer.

13. The method of claim 12 wherein said interlevel dielectric layer is $SiO_2$.

14. The method of claim 13 wherein said $SiO_2$ interlevel dielectric layer has a thickness of about 10,000 Angstroms.

15. The method of claim 12 wherein said interlevel dielectric layer is borophosphosilicate glass.

16. The method of claim 15 wherein said borophosphosilicate glass interlevel dielectric layer has a thickness of at least 10,000 Angstroms.

17. The method of claim 12 wherein said isotropic etch uses wet or dry etching with HF.

18. The method of claim 12 wherein said vertical anisotropic etch uses $CHF_3+CHF_4$ reactive ion etch at a temperature between about 20° C. and 40°.

19. The method of claim 12 wherein said Argon sputter etch uses $CF_4$ doped argon sputter etching having a $CF_4$ to argon ratio of less than 20%.

20. The method of claim 12 wherein said integrated circuit structure includes metal oxide semiconductor field effect transistors.

21. The method of claim 12 wherein said integrated circuit structure includes bipolar transistors.

* * * * *